United States Patent [19]

Bunyan

[11] Patent Number: 5,115,104
[45] Date of Patent: May 19, 1992

[54] EMI/RFI SHIELDING GASKET

[75] Inventor: Michael A. Bunyan, Derry, N.H.

[73] Assignee: Chomerics, Inc., Woburn, Mass.

[21] Appl. No.: 677,730

[22] Filed: Mar. 29, 1991

[51] Int. Cl.$^5$ .............................................. H05K 9/00
[52] U.S. Cl. ............................ 174/35 GC; 277/228; 277/229; 277/235 R
[58] Field of Search ............... 174/35 GC, 35 R; 219/10.55 R, 10.55 D; 361/424; 277/227, 228, 229, 235 R, 901

[56] References Cited

U.S. PATENT DOCUMENTS

| | | | |
|---|---|---|---|
| 3,973,059 | 8/1976 | Brown et al. | 427/180 |
| 4,243,460 | 1/1981 | Nagler | 136/275 |
| 4,246,294 | 1/1981 | Jordan | 427/27 |
| 4,311,113 | 1/1982 | Jordan | 118/629 |
| 4,505,224 | 3/1985 | Kranz | 118/636 |
| 4,622,192 | 11/1986 | Ma | 264/136 |
| 4,647,714 | 3/1987 | Goto | 174/36 |
| 4,664,971 | 5/1987 | Soens | 428/288 |
| 4,684,762 | 8/1987 | Gladfelter | 174/36 |
| 4,810,549 | 3/1989 | Abrams et al. | 428/88 |
| 4,857,377 | 8/1989 | Daimon et al. | 248/90 |
| 4,963,422 | 10/1990 | Katz et al. | 428/90 |
| 4,968,854 | 11/1990 | Benn, Sr. et al. | 174/35 GC |
| 4,977,295 | 12/1990 | Chin et al. | 174/35 GC |

*Primary Examiner*—Leo P. Picard
*Assistant Examiner*—Bot Ledynh
*Attorney, Agent, or Firm*—John Dana Hubbard; Celia H. Ketley; William L. Baker

[57] ABSTRACT

A shielding gasket is provided, comprising a conductive or non-conductive resilient core, the surface of which is rendered electrically conductive by flocking with conductive fibers. The gasket is inexpensive, lightweight and allows a low closure force. The invention further provides a method of rendering selected areas of the surface of a core conductive by selectively flocking with conductive fibers.

26 Claims, 1 Drawing Sheet

EMI/RFI SHIELDING GASKET

BACKGROUND OF THE INVENTION

The present invention relates to an EMI/RFI shielding gasket. More particularly, the invention relates to a gasket having one or more areas covered by a conductive fiber flocking.

The operation of conventional electronic equipment is typically accompanied by the generation of radio frequency and/or electromagnetic radiation in the electronic circuitry of the electronic system. If not properly shielded, such radiation can cause considerable interference with unrelated equipment. Accordingly, it is necessary to effectively shield and ground all sources of radio frequency and electromagnetic radiation.

In instances where the radiation-generating equipment is permanently housed in a container, effective shielding may be accomplished easily through proper construction of the enclosure. However, when the equipment housing is provided with a readily openable access panel or door, effective radio frequency interference (RFI) or electromagnetic interference (EMI) shielding presents more of a problem. Many electronic installations such as computer rooms were made in the past without a full understanding of the effect of partially unshielded enclosures, such as access doors. Thus, manufacturers and users of older electronic equipment have attempted to upgrade the level of EMI/RFI shielding through retrofit installation of shielding gaskets around these access openings. Enclosures and equipment which are susceptible to electromagnetic/radiofrequency interference, e.g. aircraft, computer housings, and computer rooms, are now designed to include such shielding gaskets.

Conventional EMI/RFI shielding gaskets may comprise a conductive elastomer, a knitted wire mesh or a knitted wire mesh over an elastomeric core. These shielding gaskets may be attached to an enclosure by rivets, welds, or screws; by a continuous, roll-formed strip metal clip, to which a shielding gasket has been attached, or by a strip of pressure sensitive adhesive.

The shielding gasket is configured such that the gasket is brought into contact with a fixed surface of the enclosure when the door or panel is closed, effectively sealing off the narrow gap otherwise typically provided between a door or panel and the oppositely facing surface areas of the housing. Various configurations, often complex in shape, are designed in order to provide maximum shielding, while minimizing the closure force required. An example of such a low closure force gasket is shown in FIG. 1.

The electrical conductivity required for effective shielding has been provided in several ways. Elastomeric gaskets are rendered conductive by incorporating electrically conductive filler into the elastomer prior to formation of the gasket. Mesh gaskets are formed from metal mesh having high electrical conductivity, and are thus inherently conductive. Elastomer/mesh gaskets typically utilize both an elastomer and a highly conductive mesh.

Unfortunately, while these methods provide adequate shielding, they also significantly increase the cost and weight of the gasket as compared to a non-conductive gasket of similar size and shape. Applications involving mobile enclosures, particularly aerospace shielding applications, pose severe weight restrictions, and thus lightweight shielding gaskets are increasingly sought after.

Furthermore, the level of conductivity, and thus shielding, which can be obtained without exceeding practical limitations on weight and cost is limited. Thus it would be advantageous to provide a means of providing a highly conductive EMI/RFI shielding gasket which is low in cost and lightweight.

Another problem with conventional methods of rendering gaskets conductive arises when a gasket configuration similar to that shown in FIG. 1 is used. In order to provide the electrical continuity necessary for EMI/RFI shielding, it is only necessary that surfaces 3 and 4 of gasket 1 be conductive. (These surfaces 3 and 4 will be in continuous contact with the door and enclosure, respectively, thus forming a continuous electrical connection between the door and enclosure, while surface 2 will be compressed against itself, when the door or panel is closed.) In such applications, rendering the entire gasket conductive with conductive filler is wasteful and adds unnecessary weight, while conforming a metal mesh to the surface of the irregularly shaped gasket is often difficult and costly.

Thus it has been desired in the shielding field to provide a lightweight, low cost shielding gasket, and further to provide such a gasket which could be selectively rendered conductive over desired areas of its surface.

SUMMARY OF THE INVENTION

The present invention overcomes the disadvantages of the prior art by providing a shielding gasket which may be formed of a conductive or non-conductive resilient core, at least a portion of the surface of which is rendered electrically conductive by flocking with conductive fibers. The resulting gasket is inexpensive, lightweight and requires a low closure force. The invention further provides a method of rendering selected areas of the surface of a core conductive by masking selected areas of the surface prior to fiber flocking.

Accordingly, the present invention relates to a gasket for shielding an enclosure from EMI/RFI interference which comprises a resilient core, the surface of which is selectively flocked with conductive fibers which are disposed on a coating of flocking adhesive to form a conductive layer thereupon.

In one embodiment of the invention, a non-conductive core is used, so that a low cost, lightweight gasket is obtained. In an alternative embodiment of the invention, a conductive core is used, providing optimal conductivity.

In its method aspects, the invention relates to a method of rendering the surface of an EMI/RFI shielding gasket conductive comprising the steps of providing a resilient core, applying a flocking adhesive to all or selected portions of said core, and flocking the surface of said core with conductive fibers to form a conductive coating. The invention further relates to a method of selectively rendering desired areas of the surface of an EMI/RFI shielding gasket conductive comprising the steps of providing a resilient core, masking areas of the surface which are to remain unflocked with a masking means, applying a flocking adhesive to the surface of the resilient core, and flocking the surface of said core with conductive fibers. In most applications, the masking means would then be removed. An alternative method of selectively flocking a gasket according to the invention comprises the steps of selectively applying flocking adhesive to areas desired to be flocked, and flocking those areas.

DETAILED DESCRIPTION OF THE INVENTION

The present invention relates to an EMI/RFI shielding gasket comprising a resilient core having a surface which is flocked with conductive fibers.

The term "gasket" as used herein is intended to apply to resilient shielding materials of all sizes and shapes. Such materials are typically used to seal the interface between an enclosure and a door or panel, but also find use in other applications such as providing electrical continuity between two adjoining panels, such as walls in a shielded room, or providing a conductive environmental seal between two adjoining equipment sections.

The term "flock" as used herein refers to the process of flock coating, whereby an article is coated with a tacky, slow drying adhesive and then a coating of short natural or synthetic fibers is dusted, blown or electrostatically applied. A "flocked" surface, thus, is one which has a fibrous coating applied by a flock coating process.

Figure 1:
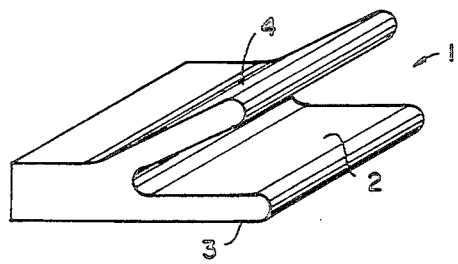
FIG. 1 is a perspective view of a standard low-closure force shielding gasket.
Figure 2:
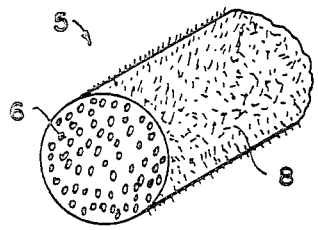
FIG. 2 is a perspective view of a fiber flocked gasket according to one embodiment of the invention.

A shielding gasket according to one embodiment of the invention is shown in FIG. 2. In this embodiment, gasket 5 comprises resilient core 6 (shown as a foam) and conductive fiber flock 8. Underlying the fiber flock layer, as shown in the greatly enlarged view of FIG. 3, is a layer of adhesive 7 which retains the fibers.

Figure 3:
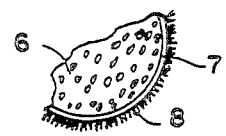
FIG. 3 is a highly enlarged view of a selected area of FIG. 2, illustrating details of the flocked surface in one embodiment of the invention.

It is preferred that the fibers be approximately perpendicular to the surface, as shown in FIG. 3. This orientation may be obtained by electrostatically directing and orienting the fibers into the conductive adhesive, by orienting and directing the fibers with vibration, or by other conventional methods for orienting such fibers.

Fibers which are suitable for use in the present invention are those which provide sufficient electrical conductivity for EMI/RFI shielding and which may be used in a flocking process. Such fibers include metal coated or plated synthetic and natural fibers, including but not limited to textile, glass, ceramic and graphite fibers, metal fibers, with or without a coating/plating of another metal, and mixtures of two or more of such types of fibers. For some applications, it may be advantageous to use fibers which are magnetic and/or microwave absorbing. Preferred fibers for use in the invention are metal plated synthetic fibers, particularly metal plated nylon. Silver plated nylon is most preferred for many applications because of its high conductivity and suitability for conventional flocking processes. The preferred length and diameter of the fibers will vary depending upon the given application. Longer fibers will generally be preferred where optimally environmental sealing is required, while shorter fibers will be preferred where a dense flocking is required for optimal conductivity. For a good balance of properties, fibers having a diameter of from about 5–50 microns, and more preferably from about 10–20 microns, and a length of from about 10–100 mils and more preferably 20–40 mils are preferred. Fibers are commercially available, or may be manufactured by chopping a conductive fabric to obtain fibers of desired length. Conductive fabric is commercially available from Sauquoit Industries, and is described in European Patent No. 185,480. Conductive fibers are commercially available from Sauquoit Industries, under the tradename X-STATIC® conductive fibers, in a variety of lengths.

The fibers may be flocked onto the gasket using any conventional flocking process. Such processes typically comprise two steps.

First, a high-tack flocking adhesive is applied to the resilient core. Many suitable adhesives are commercially available and are known in the art. One such adhesive is described in U.S. Pat. No. 4,963,422. A preferred flocking adhesive is a thermoset urethane commercially available from Lord Adhesives under the tradename FLOCKLOCK® adhesive. Also suitable are urethane primers available from Lord under the tradename CHEMLOCK®, thermoset and thermoplastic urethane adhesives in general, and other flocking adhesives such as acrylics, e.g. methylmethacrylate, silicones, ethylene vinyl acetate (EVA), and polyester adhesives. Preferred properties for a flocking adhesive for use in the present invention are flexibility and temperature resistance. If a gasket having maximum electrical conductivity is desired, the adhesive may be rendered electrically conductive by the addition of conductive fillers. Such fillers are well known in the art. Preferred fillers are those listed in U.S. Pat. No. 4,931,479 at column 6, the disclosure of which is incorporated herein by reference. The flocking adhesive may be applied to the gasket surface using any suitable technique, e.g. knife coating, dipping, spraying, and the like.

Second, the fibers are applied to the adhesive coated surface, and oriented if desired. A preferred method of application is electrostatic deposition, a process which is well known in the flocking art. The fibers may, however, be applied by any suitable process, e.g. vibration, blowing, or dusting.

Subsequent to application of the fibers, the flocking adhesive is allowed to dry. This may be accomplished at ambient or elevated temperatures, depending upon the flocking adhesive used and the desired drying time.

A particularly advantageous aspect of the present invention is that fiber flocking presents the opportunity to render selected areas of the gasket surface conductive, while the remainder of the gasket remains nonconductive. This allows substantial cost and weight savings in applications in which it is unnecessary that the entire surface of the gasket be conductive, and is particularly useful for gaskets having complex shapes.

Figure 4:
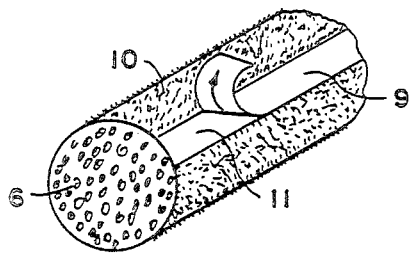
FIG. 4 is a schematic diagram showing a means of fiber flocking selected areas of a gasket according to one embodiment of the invention.

As shown in FIG. 4, one means of selectively flocking a gasket is to apply a mask, e.g. tape strip 9, to the surface of the resilient core 6 prior to the flocking process. After flocking, this mask can be stripped away, leaving flocked areas 10 and unflocked areas 11, as shown.

An alternative method for selectively flocking is to apply the flocking adhesive to the areas desired to be flocked, e.g. by brush or knife coating the adhesive on those areas. This method is suitable for use with adhesive application methods which allow selective coating, rather than methods such as dip coating, which inherently result in the coating of adhesive over the entire surface.

Figure 5:
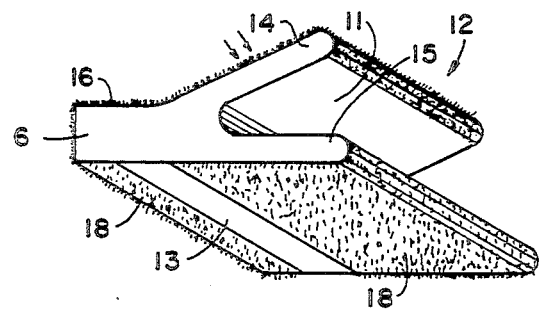
FIG. 5 is a perspective view of the gasket shown in FIG. 1 which has been selectively flocked according to the method of the invention.

As well as reducing the cost and weight of the gasket, selective flocking also facilitates the use of a pressure sensitive adhesive as an attachment means for the gasket. As shown in FIG. 5, a gasket can be selectively flocked such that an unflocked area is left which may then easily be coated with a pressure sensitive adhesive to form pressure sensitive adhesive strip 13. Alternatively, provision of the pressure sensitive adhesive strip may be consolidated with the masking step, by first applying a pressure sensitive adhesive to a selected area of the resilient core, applying a release paper to the pressure sensitive adhesive, and flocking the gasket.

The pressure sensitive adhesive is generally applied in tape form. It is preferred to use a double sided tape or a transfer adhesive tape. Depending on the compatibility of the adhesive with the resilient core, the tape may be applied by hand, or using up to about 20 psi nip roll pressure to promote bonding of the adhesive to the core. It is preferred that the adhesive be electrically conductive, in order to ensure optimal shielding. However, conventional pressure sensitive adhesives may be used. The adhesive strip is preferably provided with a protective, releasable covering means. This may be a siliconized paper or release film, or other conventional releasable covering material, and serves to protect the adhesive from contamination and facilitate storage and application of the gasket.

FIG. 5 also illustrates one application for the selective flocking process to reduce weight and cost. As discussed hereinabove, in certain applications the entire gasket need not be conductive. This is true of gaskets which are shaped such that they comprise a plurality of flanges which compress together when the gasket is in use. In FIG. 5, gasket 12 comprises flanges 14 and 15, which deflect together when the door or panel of the shielded enclosure is closed. Gasket 12 is thus selectively flocked such that surfaces 16 and 18, which are in contact with the enclosure and door during use, are conductive. Surface 11, the inside surface of the two flanges, remains unflocked, since it need not be electrically conductive.

The resilient core may be formed from a variety of materials known in the gasket art. In a preferred embodiment, the core is of an elastomeric foam, such as a foamed elastomeric thermoplastic, foamed natural or synthetic rubbers, e.g. neoprene, foamed urethane or foamed silicone. This foam may be open or closed cell and may have a skinned surface if desired. Conventional unfoamed rubbers, urethanes, silicones, thermoplastic elastomers and other suitable materials in solid or hollow form may also be used. The resilient core may also be a foam surrounded by a hollow unfoamed elastomer. In applications in which low cost and lightweight are critical requirements, the core is preferably non-conductive. Alternatively, in applications in which maximum shielding effectiveness is critical, the core is preferably electrically conductive. If an electrically conductive core is desired, conductivity can be provided by incorporating conductive fillers, e.g. carbon, silver, nickel and the like into the elastomer.

For applications in which a low closure force gasket is desired, (i.e. a gasket which requires a force of less than about 5 lbs./linear inch to close the door or panel while obtaining the necessary deflection of the gasket so as to ensure proper electrical mating of the door to the frame through the gasket), the core of the gasket is formed of a light, highly resilient and conformable polyurethane foam which has a required closure force of one pound per linear inch or less.

After manufacture of the gasket described above, the gasket would be applied around the periphery of an access door or other opening of an enclosure. The gasket could also be used in other shielding applications in which it could be useful. In the embodiment in which the gasket comprises a pressure sensitive adhesive strip, the gasket would typically be applied by stripping the release film (if present) from the adhesive and then pressing the adhesive strip against the substrate to which the gasket is applied. When the gasket requires replacement it can be easily removed by peeling it from the enclosure surface. Alternatively, the gasket could be retained on the enclosure by a metal or plastic clip, or other conventional retaining means. In the embodiment in which the resilient core comprises an unfoamed elastomer, hollow or solid, or a foam surrounded by a hollow unfoamed elastomer, the elastomer may be formed, e.g. extruded or molded, such that the elastomer provides an integral clip. In this case it is preferred that the gasket surface be selectively flocked such that the integral clip remains unflocked.

The following example is provided to further illustrate the invention, and is not intended to be of limiting effect.

EXAMPLE 1

A gasket according to the invention was produced as follows. First, a small length of foam core was provided (approximately 5 inches long, SANTOPRENE® foam, commercially available from Norton Chemical). This foam core was lightly coated with FLOCK-LOCK® 851 adhesive. The coated core was then suspended in a plastic container with X-STATIC® conductive fibers, 0.76 mm average length. The container was shaken vigorously, causing the conductive fibers to contact and adhere to the coated surface. The flocked core was then removed from the container and placed in an oven at 200° F. for 10 minutes to drive off solvent and initiate cure of the flocking adhesive.

The fiber pick-up of the core surface was calculated at 0.68 g/ft. Surface conductivity of the sample was measured to be 2 ohms. The conductive fibers were well secured and densely packed.

While preferred embodiments of this invention have been described in detail hereinabove, it is to be understood that many changes and modifications may be made by those skilled in the art without departing from the scope and spirit of this invention.

What is claimed is:

1. A shielding gasket comprising a resilient core, having an outer surface at least a portion of which surface has a coating of a flocking adhesive, said coating having a layer of conductive fibers bonded therearound.

2. A gasket of claim 1 wherein the resilient core is an elastomer.

3. A gasket of claim 2 wherein the resilient core is selected from the group consisting of elastomeric thermoplastics, natural rubbers, synthetic rubbers, urethanes.

4. A gasket of claim 1 wherein the resilient core is non-conductive.

5. A gasket of claim 1 wherein the resilient core is foamed.

6. A gasket of claim 1 wherein the resilient core is electrically conductive.

7. A gasket of claim 1 wherein the resilient core comprises an elastomer and a conductive filler incorporated into the elastomer.

8. A gasket of claim 1 wherein the conductive fibers are metal plated or coated natural fibers.

9. A gasket of claim 1 wherein the conductive fibers are metal fibers.

10. A gasket of claim 1 wherein the conductive fibers are selected from the group consisting of metal plated or coated synthetic, glass, ceramic, and graphite or metal fibers.

11. A gasket of claim 1 wherein the conductive fibers are magnetic.

12. A gasket of claim 1 wherein the conductive fibers are microwave absorbing.

13. A gasket of claim 10 wherein the conductive fibers comprise a mixture of two or more types of fibers.

14. A gasket of claim 1 wherein the fibers are metal plated nylon fibers.

15. A gasket of claim 1 wherein the fibers have a length of from about 10 to 100 mils.

16. A gasket of claim 1 wherein the fibers have a length of from about 20-40 mils.

17. A gasket of claim 1 wherein the fibers have a diameter of from about 5 to 50 microns.

18. A gasket of claim 1 wherein the fibers have a diameter of from about 10 to 20 microns.

19. A gasket of claim 1 wherein the flocking adhesive is selected from the group consisting of thermoset or thermoplastic urethanes, acrylics, silicones, ethylene vinyl acetate (EVA), and polyester adhesives.

20. A gasket of claim 1 wherein the entire surface is flocked.

21. A gasket of claim 1 wherein selected portions of the gasket surface are unflocked.

22. A gasket of claim 1 further comprising an attachment means.

23. A gasket of claim 22 wherein said attachment means comprises an area of pressure sensitive adhesive disposed on the outer surface of the gasket.

24. A gasket of claim 23 wherein the pressure sensitive adhesive is disposed on an unflocked area of the gasket surface.

25. A gasket of claim 22 wherein said attachment means comprises a metal clip.

26. A gasket of claim 25 wherein said clip is integral with the outer surface of said gasket.

* * * * *

UNITED STATES PATENT AND TRADEMARK OFFICE
CERTIFICATE OF CORRECTION

PATENT NO. : 5,115,104

DATED : May 19, 1992

INVENTOR(S) : Michael H. Bunyan

It is certified that error appears in the above-identified patent and that said Letters Patent is hereby corrected as shown below:

On the title page, item [75],

Please correct the name of the Inventor from "Michael A. Bunyan" to --Michael H. Bunyan--.

Signed and Sealed this

Second Day of November, 1993

Attest:

BRUCE LEHMAN

Attesting Officer

Commissioner of Patents and Trademarks